United States Patent [19]
Freund et al.

[11] Patent Number: 6,029,427
[45] Date of Patent: Feb. 29, 2000

[54] METHOD AND APPARATUS FOR HANDLING SEMICONDUCTOR CHIPS

[75] Inventors: Joseph Michael Freund, Fogelsville; George John Przybylek, Douglassville; Dennis Mark Romero, Allentown, all of Pa.

[73] Assignee: Lucent Technologies, Inc., Murray Hill, N.J.

[21] Appl. No.: 09/285,774

[22] Filed: Apr. 5, 1999

[51] Int. Cl.[7] .............................. B65D 85/90; B65B 25/00
[52] U.S. Cl. .................. 53/471; 206/460; 206/723; 206/725
[58] Field of Search ...................... 206/460, 701, 206/714, 723, 725; 53/449, 471

[56] References Cited

U.S. PATENT DOCUMENTS

| | | |
|---|---|---|
| 3,970,494 | 7/1976 | Pritchard . |
| 4,298,120 | 11/1981 | Kaneko et al. . |
| 4,966,281 | 10/1990 | Kawanishi et al. ............... 206/714 |
| 4,966,282 | 10/1990 | Kawanishi et al. . |
| 5,590,787 | 1/1997 | Hodges . |
| 5,636,745 | 6/1997 | Crisp et al. . |
| 5,648,136 | 7/1997 | Bird .................................. 206/714 |
| 5,700,045 | 12/1997 | Ganapol et al. . |
| 5,833,073 | 11/1998 | Schatz et al. . |
| 5,848,702 | 12/1998 | Pakeriasamy ..................... 206/725 |

*Primary Examiner*—Jim Foster
*Attorney, Agent, or Firm*—Dickstein Shapiro Morin & Oshinsky LLP

[57] ABSTRACT

An apparatus and a method for receiving and transporting semiconductor chips. The chips are placed in pockets on a top surface of a first carrier. A similar carrier has an adhesive sheet placed on its top surface, and it is inverted and placed on the first carrier. A vacuum is pulled on orifices leading to the pockets. The vacuum pulls the flexible sheet into contact with the chips. The second carrier is then removed from the first carrier. Air pressure may be introduced to assist in the removal. A cover may be placed over the second carrier.

30 Claims, 4 Drawing Sheets

METHOD AND APPARATUS FOR HANDLING SEMICONDUCTOR CHIPS

FIELD OF THE INVENTION

The present invention relates to a system for handling semiconductor chips. More particularly, the present invention relates to an apparatus and a method for receiving, storing and/or transporting semiconductor chips.

BACKGROUND OF THE INVENTION

Semiconductor chips are routinely manufactured in one or more locations and then transported to a distant location for incorporation into electronic packages or devices. Commonly, semiconductor chips are transported in flat packs. Some flat packs have pockets for transporting the chips. At the point of assembly of the chips into the devices, pick and place equipment, such as, for example, robotic equipment, is used to remove the chips from the flat packs and solder the chips into the devices. The pick and place equipment may be used in conjunction with vision equipment.

Sometimes, chips will arrive at the point of assembly tilted within the flat pack pocket. Other times, the chips have been jostled completely out of the pocket. Due to the improper positioning of some chips during transportation, a percentage of chips arrive at the point of assembly in an unusable state, i.e., broken or crushed. The improper positioning may occur due to the flat pack being disturbed or due to a cover on the flat pack being removed. Even if a misaligned chip is undamaged, vision equipment used in conjunction with pick and place equipment may be unable to identify and properly align the chip.

U.S. Pat. No. 5,833,073 (Schatz et al.) refers to the use of a frame having tacky film for transporting semiconductor chips. However, the Schatz et al. frame lacks pockets into which chips can be placed. Without such pockets, the semiconductor chips may be placed on the film in such a way that the vision equipment may experience difficulty in identifying and retrieving the chips. Further, the tacky film may fall off or lose its adherence to the undersurface of the frame. If the tacky film loses its adherence to the frame, the chips may become damaged. Additionally, certain conventionally used tacky films have adhesion properties which increase over time, thus making it difficult to release semiconductor chips after a certain period of time.

There is, therefore, a need for an apparatus which safely and efficiently transports semiconductor chips while keeping the chips in proper alignment.

SUMMARY OF THE INVENTION

The present invention provides an apparatus for receiving and transporting semiconductor chips. The apparatus has a carrier, with pockets on a top surface, and an adhesive layer positioned on the top surface.

In a preferred embodiment of the invention, the adhesive layer has adhesive properties which diminish in the presence of heat or other electromagnetic radiation.

The present invention also provides a system for receiving and transporting semiconductor chips having a pair of carriers. At least one of the carriers has pockets in a top surface. One carrier, which includes an adhesive layer on a top surface, is inverted and placed on the top surface of the second carrier which contains the chips. The chips are adhered to the adhesive layer and are transported with the first carrier upon its removal from the second carrier.

In a preferred embodiment, a cover is placed on the first carrier after the chips become adhered to the adhesive sheet.

The present invention also provides a method for receiving and transporting semiconductor chips. The method includes the steps of putting chips in the pockets of a first carrier, providing an adhesive layer on a second carrier, inverting the second carrier onto the first carrier, adhering the chips to the adhesive layer, and removing the second carrier.

In a preferred embodiment, the pockets each have an orifice and a vacuum is introduced to assist in adhering the chips to the adhesive layer.

These and other advantages will become apparent from the following detailed description of preferred embodiments of the invention.

DETAILED DESCRIPTION OF PREFERRED EMBODIMENTS

Figure 1:
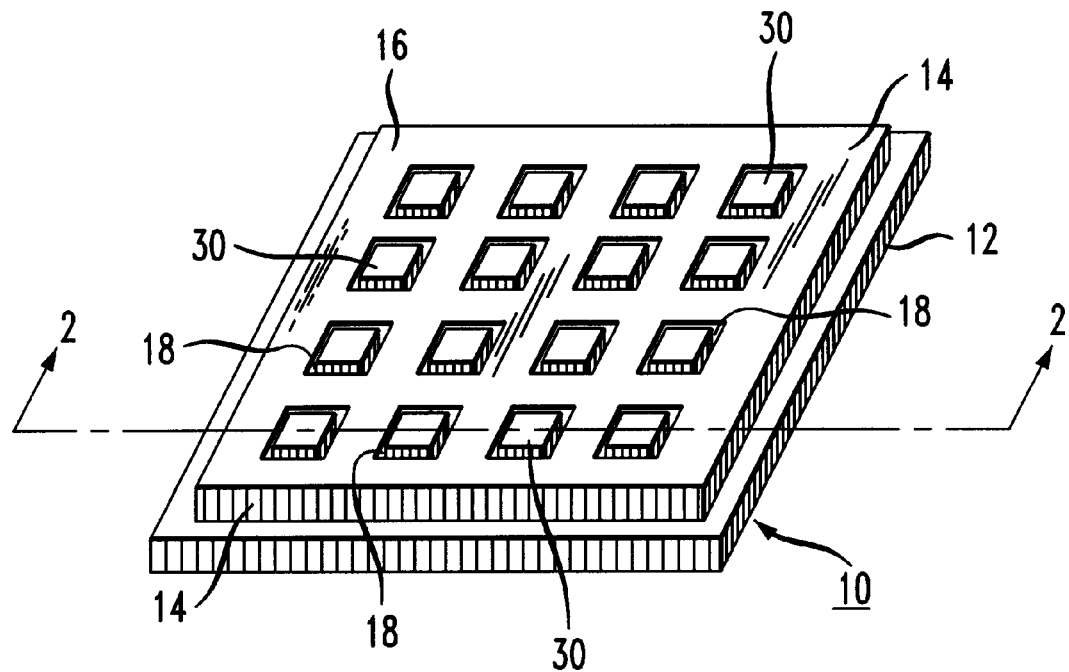
FIG. 1 is a perspective view of a first carrier constructed in accordance with a preferred embodiment of the present invention.

Referring now to the drawings, where like numerals designate like elements, there is shown in FIG. 1 a semiconductor chip carrier 10, also known as a flat pack. The carrier 10 includes an upper portion 14 and a lower portion 12, the lower portion 12 having a greater length and width than the upper portion 14. The upper portion 14 includes an upper surface 16. A plurality of pockets 18 are located in the upper surface 16 of the upper portion 14. Each pocket 18 contains a semiconductor chip 30.

The pockets 18 are used to protect the semiconductor chips 30 during movement of the carrier 10. Further, the pockets 18 are used to align the chips 30 so that vision equipment and pick and place equipment (not shown) may be used to remove the chips 30 from the carrier 10 for assembly in an electronic device.

Figure 2:
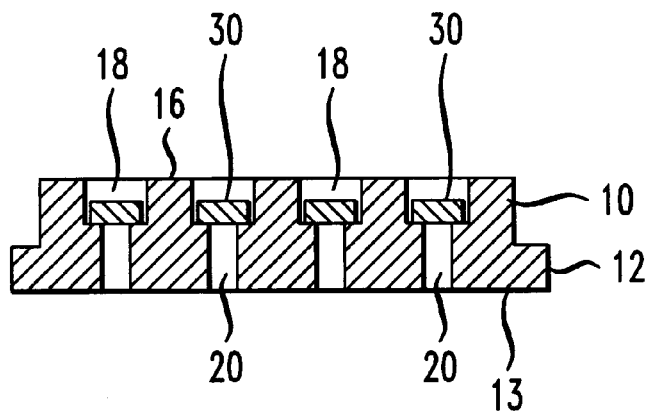
FIG. 2 is a cross-sectional view of the first carrier of FIG. 1 taken along line 2—2.

As shown in FIG. 2, an orifice 20 extends from each pocket 18 to a base surface 13 of the carrier 10. The orifices 20 are adapted to receive a vacuum and to receive air pressure (both to be described in more detail below).

Figure 3:
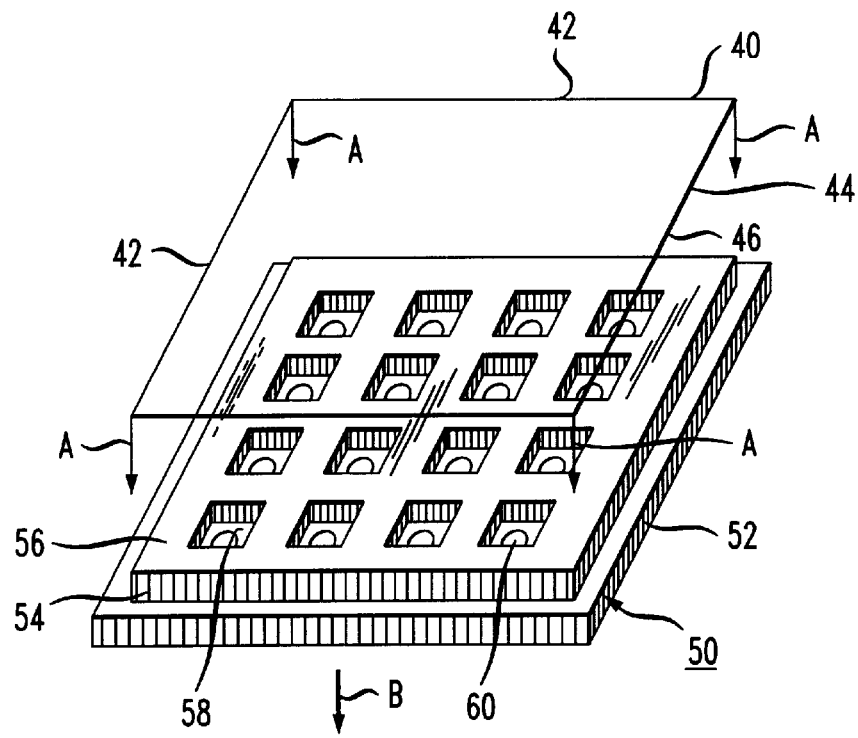
FIG. 3 is a perspective view of a second carrier like the carrier of FIG. 1 upon which an adhesive layer is being placed.

FIG. 3 shows a second carrier 50, similar to carrier 10, and having a lower portion 52 and an upper portion 54. The upper portion 54 includes a top surface 56. Pockets 58 are located in the upper portion 54. Each pocket 58 includes an orifice 60 extending down to a base surface 53 of the lower portion 52. An adhesive tape, or sheet, 40 is positioned on the upper surface 56 of the second carrier 50. As shown in FIG. 2, the adhesive sheet 40 is moved in the direction of arrows A so as to be positioned on the upper surface 56.

The adhesive sheet 40 includes a top surface 44 and an undersurface 46. The adhesive sheet 40 has an adhesive 42 on at least the top surface 44. The adhesive may also be applied to the entire undersurface 46, or in selected portions of the undersurface 46. As shown in FIG. 2, the undersurface 46 is placed into contact with the upper surface 56 of the carrier 50.

The adhesive 42 may be an ordinary adhesive having a property to adhere to most surfaces across a wide range of pressure and temperature profiles. Alternatively, the adhesive sheet 40 may be a thermal release adhesive tape 40 having thermally deactivated adhesive 42. Specifically, the adhesive 42 may have adhering properties that dissipate or diminish in the presence of electromagnetic radiation, such as, for example, heat. Further, the adhesive 42 has adhering properties which may not increase over time.

Figure 4:
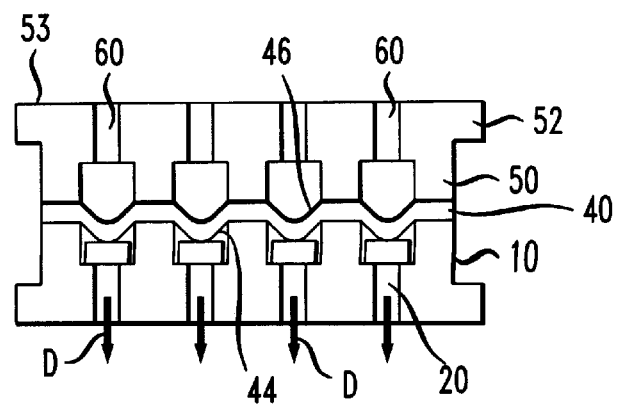
FIG. 4 is a schematic side view of the adherence of semiconductor chips to an adhesive layer.
Figure 5:
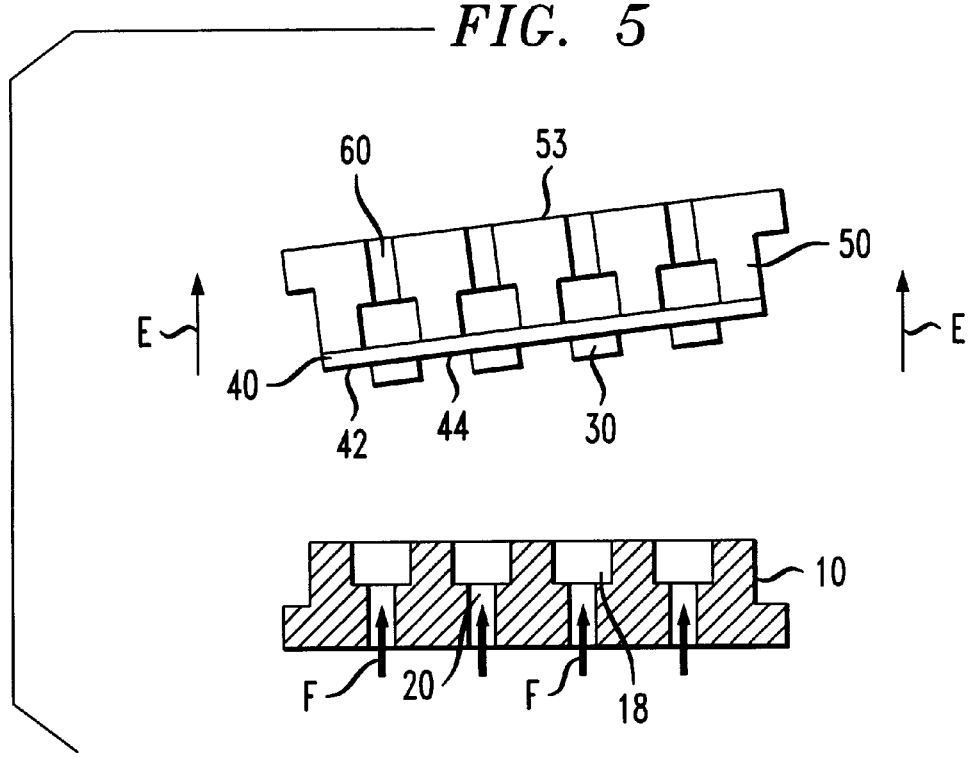
FIG. 5 is a schematic side view of the removal of the second carrier from the first carrier.
Figure 6:
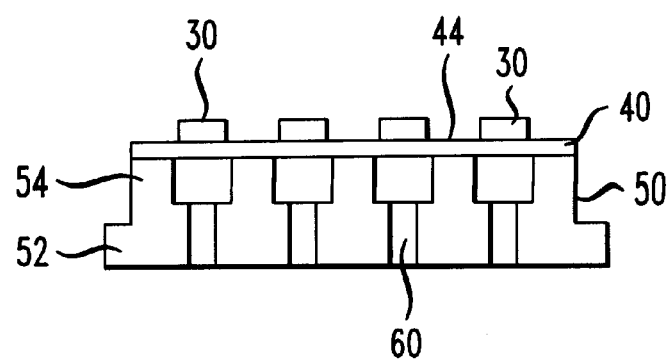
FIG. 6 is a schematic side view of the second carrier with the adhered semiconductor chips.

FIGS. 4–6, show a method for receiving and transporting the semiconductor chips 30. As shown in FIG. 4, the carrier 10 is positioned beneath the carrier 50. The carrier 10 includes a plurality of chips 30 resident within the pockets 18. As shown, the carrier 50 has been inverted such that the adhesive sheet 40 is positioned directly over and in contact with the upper surface 16 of the carrier 10.

A vacuum is introduced to the carrier 10 in the direction of arrows D through the orifices 20. The vacuum creates a pulling force on the adhesive sheet 40 such that the top surface 44 of the adhesive sheet 40 comes in contact with and adheres to the semiconductor chips 30. The vacuum must be strong enough to cause such contact, but not so strong as to pull the adhesive sheet 40 off of the carrier 50.

With reference to FIG. 5, the second carrier 50 is moved away from the carrier 10 in the direction of arrows E. The semiconductor chips 30 are adhered to the top surface 44 of the adhesive sheet 40. To assist in the removal of the carrier 50 from the carrier 10, air pressure may be introduced in the direction of arrows F through the orifices 20. With reference to FIG. 6, the second carrier 50 is re-inverted such that the semiconductor chips 30 are positioned above the top surface 44 of the adhesive sheet 40. An advantage of the invention is that it is inexpensive, since it utilizes carriers currently in service. In a preferred embodiment of the invention, the first and second carriers 10, 50 may be identical to each other.

Figure 7:
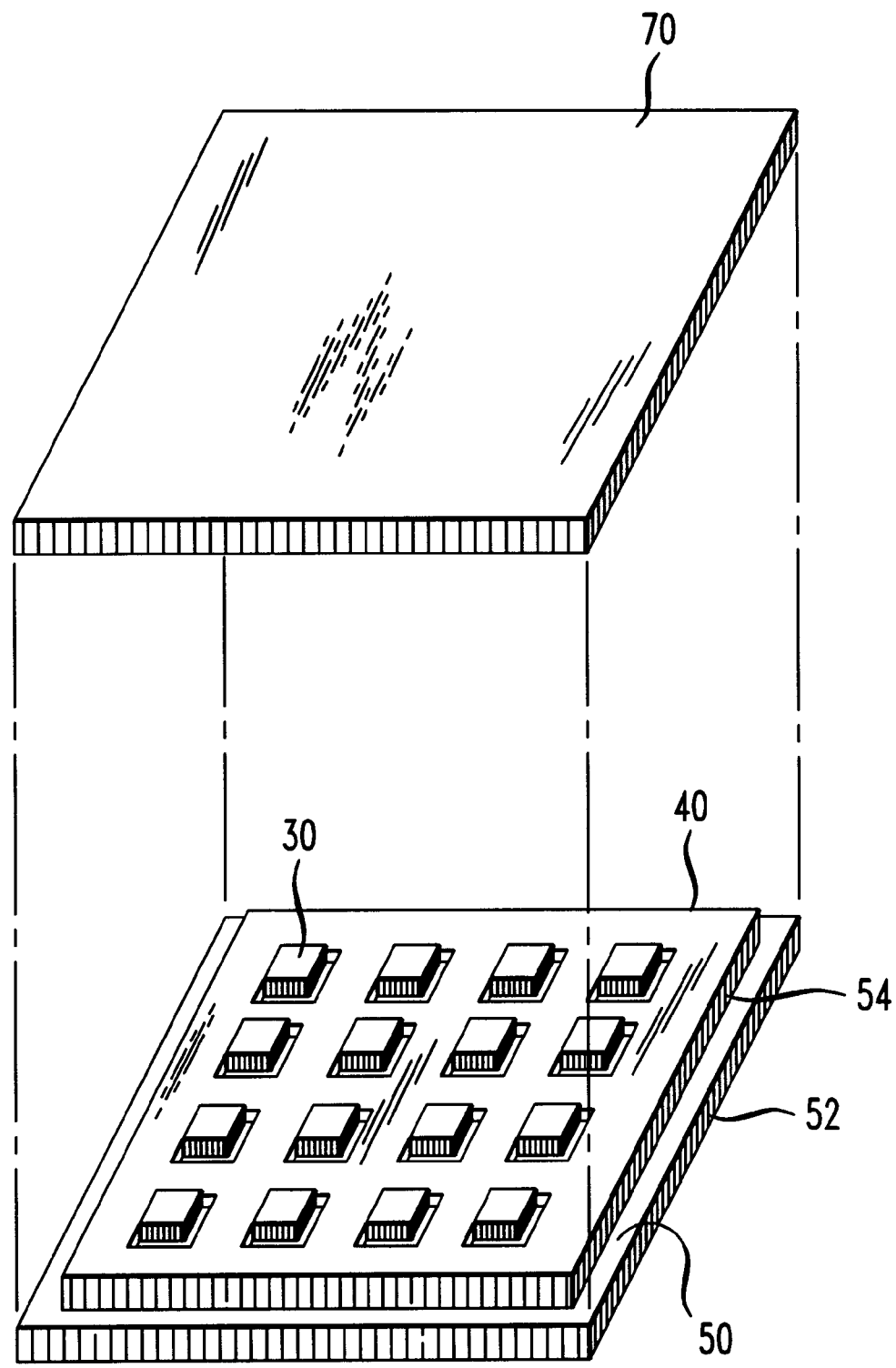
FIG. 7 is a perspective view of the second carrier of FIG. 6 upon which a cover is being positioned.

With reference to FIG. 7, a cover 70 may optionally be placed on the second carrier 50 to add extra protection to the semiconductor chips 30 during transportation. Specifically, the cover 70 may be placed such that it contacts the lower portion 52 of the second carrier 50, thereby encompassing the upper portion 54 of the carrier 50. The presence of the adhesive sheet 40 prevents the chips 30 from becoming jostled by removal of the cover 70.

Upon being transported to the point of assembly, the cover 70 is removed and the pick and place equipment disengages the chips 30 from the adhesive sheet 40. Alternatively, if the adhesive 42 is a thermal release adhesive, the adhesive sheet 40 is heated to a release temperature, i.e., the temperature at which enough of the adhering properties have diminished to allow easy retrieval of the chips 30. Preferably, a temperature of 90° C. will suffice.

Since the chips 30 propagate heat, a heated collet on pick and place equipment may be used to release the chips 30 from the adhesive sheet 40.

The above description and drawings are only illustrative of certain preferred embodiments which achieve the objects, features and advantages of the present invention. The present invention is not to be considered as limited to these specific embodiments, but is only limited by the scope of the appended claims.

What is claimed as new and desired to be protected by Letters Patent of the United States is:

1. An apparatus for handling semiconductor chips, said apparatus comprising:
 a carrier having a top surface, a plurality of pockets located in said top surface, and vacuum orifices for said pockets; and
 a flexible adhesive material positioned on said top surface of said carrier, and wherein said flexible adhesive material covers said pockets.

2. The apparatus of claim 1, wherein said carrier has a bottom surface opposite said top surface, and wherein said orifices are located in said bottom surface.

3. The apparatus of claim 1, wherein said orifices are adapted to receive pressurized gas.

4. The apparatus of claim 1, wherein said adhesive material is configured to adhere to the chips.

5. The apparatus of claim 1, wherein the adhesive properties of said adhesive layer are diminished in the presence of electromagnetic radiation.

6. The apparatus of claim 5, wherein the electromagnetic radiation is heat.

7. The apparatus of claim 1, further comprising a cover positioned on said carrier, and wherein said adhesive material is located between said cover and said carrier.

8. An apparatus for receiving and transporting semiconductor chips, said apparatus comprising:
 a carrier having an upper portion and a lower portion, said upper portion having a top surface, and a plurality of pockets in said top surface, and vacuum orifices connected to said pockets;
 an adhesive sheet positioned on said top surface and covering said pockets, said adhesive sheet having an adhesive on at least one surface, wherein the chips adhere to said adhesive, and wherein said adhesive has adhesive properties which diminish in the presence of electromagnetic radiation.

9. The apparatus of claim 8, wherein said electromagnetic radiation is heat.

10. The apparatus of claim 8, further comprising a cover positioned on said carrier.

11. A system for receiving and transporting semiconductor chips, said system comprising:
 first and second carriers each having a top surface, pockets located in said top surfaces for receiving the semiconductor chips, and vacuum orifices connected to said pockets; and
 an adhesive layer positioned on said top surface of said second carrier, and wherein said adhesive layer covers said pockets of said second carrier, said adhesive layer being arranged to adhere to semiconductor chips located in said pockets of said first carrier.

12. The system of claim 11, wherein said adhesive layer is flexible to be pulled by vacuum into said pockets of said first carrier to contact the chips.

13. The system of claim 12, wherein said orifices of said first carrier to receive pressurized gas to remove said adhesive layer from said first carrier.

14. The system of claim 11, further comprising a cover, said system being arranged to receive the chips between the cover and the adhesive layer.

15. The system of claim 11, wherein said adhesive layer has adhesive on a first surface to adhere to the chips, and adhesive on a second surface to adhere to said second carrier.

16. The system of claim 15, wherein the adhesive properties of said adhesive on said first surface of said adhesive layer diminish in the presence of electromagnetic radiation.

17. The system of claim 16, wherein the electromagnetic radiation is heat.

18. The system of claim 11, wherein said pockets of said first and second carriers have the same configuration.

19. A system for receiving and transporting semiconductor chips, said system comprising:

first and second carriers each having a top surface, each said carrier having a plurality of pockets in each said top surface, each said pocket having a vacuum orifice and adapted to receive one of the chips;

a flexible adhesive layer positioned on said top surface of said second carrier, and wherein said adhesive layer covers said pockets of said second carrier; and a cover on said adhesive layer.

20. The system of claim 19, wherein said adhesive layer has an adhesive on at least one surface.

21. The system of claim 20, wherein the adhesive properties of said adhesive diminish in the presence of electromagnetic radiation.

22. The system of claim 21, wherein the electromagnetic radiation is heat.

23. A method of handling semiconductor chips, said method comprising the steps of:

placing the chips in pockets in a top surface of a first carrier;

providing an adhesive sheet on a top surface of a second carrier;

placing said second carrier on said first carrier such that said adhesive sheet contacts said top surface of said first carrier; and adhering the chips to said adhesive sheet.

24. The method of claim 23, further comprising the step of removing said second carrier from said first carrier.

25. The method of claim 24, further comprising the step of drawing a vacuum through said first carrier.

26. The method of claim 24, further comprising the step of placing a protective cover over said second carrier.

27. The method of claim 24, further comprising the step of introducing a pressurized gas through said orifices.

28. The method of claim 24, further comprising the step of diminishing the adhesive properties of said adhesive layer by electromagnetic radiation.

29. The method of claim 28, wherein said step of diminishing the adhesive properties of said adhesive layer occurs subsequent to said step of removing said second carrier from said first carrier.

30. The method of claim 29, further comprising the step of applying heat to the chips.

* * * * *